United States Patent
Freund et al.

[11] Patent Number: 6,026,557
[45] Date of Patent: Feb. 22, 2000

[54] METHOD FOR LASER BAR FACET COATING

[75] Inventors: Joseph Michael Freund, Fogelsville; George John Przybylek, Douglasville; Dennis Mark Romero, Allentown, all of Pa.

[73] Assignee: Lucent Technologies Inc., Murray Hill, N.J.

[21] Appl. No.: 09/054,138

[22] Filed: Apr. 2, 1998

[51] Int. Cl.[7] ........................................ B23Q 7/00
[52] U.S. Cl. .................. 29/559; 269/224; 269/254 R; 118/500
[58] Field of Search ................ 29/450, 559; 269/224, 269/254 R; 118/500

[56] References Cited

U.S. PATENT DOCUMENTS

| | | |
|---|---|---|
| 2,679,111 | 5/1954 | Leischner . |
| 5,911,830 | 6/1999 | Chakrabarti et al. ............ 118/503 |
| 5,940,424 | 8/1999 | Dietrich et al. ............ 372/49 |

OTHER PUBLICATIONS

RD33156, Anonymous, Miniature vice for supporting laser diod bars, Research Disclosure Nov. 1991.

Primary Examiner—P. W. Echols
Assistant Examiner—John C. Hong

[57] ABSTRACT

Apparatus and method for retaining a laser bar during a facet coating operation and releasing the laser bar subsequent to the operation. The apparatus includes a pair of opposing spacers that hold the laser bar when compressed, each spacer including a compliant spring on an inner portion thereof. A compression device applies a force to the spacers sufficient to compress the springs against opposite sides of the laser bar to thereby retain the laser bar during the facet coating operation. Subsequent to the facet coating operation, the compressive force is released to decompress the springs and thereby release the laser bar. Due to the spring action, the laser bar is released without substantially adhering to either one of the spacers.

4 Claims, 4 Drawing Sheets

METHOD FOR LASER BAR FACET COATING

FIELD OF THE INVENTION

The present invention relates generally to laser device fabrication, and more particularly, to an apparatus for retaining a laser bar during a facet coating operation and for automatically releasing the bar thereafter.

BACKGROUND OF THE INVENTION

Semiconductor laser devices such as double heterostructure laser diodes are utilized in various applications such as for optical sources in fiber optic communications. In the manufacture of such devices, double heterostructures are grown and processed on a wafer substrate by, for example, liquid phase epitaxy. The wafer is then cleaved into typically solid rectangular laser bars containing many laser diodes. The laser diodes are functional at the laser bar level, and therefore electrical testing is often performed at this level prior to dicing the individual laser diodes from the bars.

Each laser bar has two end faces (facets) formed by cleaving during the cleaving process. Ultimately, laser light is transmitted through the facets, so it is important for their surfaces to remain unperturbed during handling of the laser bar. Following the cleaving operation on the wafer to form the laser bars, the facets are coated with an optical coating in a facet coating apparatus. A facet coat holding fixture is typically employed to retain the laser bar during the facet coating and also to transport the bar into and out of the facet coating apparatus.

FIG. 1 illustrates a prior art facet coat holding fixture 18 for retaining a laser bar 10 during a facet coating operation. Fixture 18 is comprised of a pair of solid rectangular fixture blades $18_1$, $18_2$ that retain laser bar 10 by sandwiching the same under a compressive force applied to side surfaces 15 thereof by a compression or clamping device 17. Laser bar 10 is a thin, solid rectangular bar with facets 14a, 14b on opposite sides, and longitudinal side surfaces 12 perpendicular to the facet surfaces. Due to its small size—e.g., typical dimensions on the order of 0.005×0.012×0.300 inches—the laser bar must be handled with extreme care to avoid damaging it. Flat side surfaces 19 of the fixture blades compress against laser bar surfaces 12 during facet coating. Once facets 14a and 14b are coated, holding fixture 18 and the retained laser bar 10 are transported out of the facet coater atop a receiving surface 13. Fixture blades $18_1$ and $18_2$ are then separated to release laser bar 10 onto surface 13 between slot S defined between the blades. The laser bar is then removed from the slot by a vacuum pick or robot arm for subsequent processing and testing operations.

The optical coating applied to the exposed facet surfaces 14a, 14b often seeps in between the side surfaces 12 of the laser bar and mating surfaces 19 of fixture blades $18_1$, $18_2$. As a result, laser bar 10 often sticks to one of the fixture blades when the blades are separated atop surface 13. An additional operation is then required to detach the laser bar from the fixture blade, e.g., manually shaking the holding fixture to loosen the laser bar or prying the laser bar from the blade with a pick. The additional operation results in a yield reduction as the laser bars tend to get damaged when pried or shaken from the fixture blades. Typically, up to 50% of the laser bars may become damaged from this operation.

SUMMARY OF THE INVENTION

The present invention is directed towards an apparatus and method for retaining a laser bar during a facet coating operation and releasing the laser bar subsequent to the operation without the laser bar substantially adhering to the apparatus. In an illustrative embodiment, the apparatus includes a pair of opposing spacers that hold the laser bar when compressed thereagainst. Each spacer includes a compliant spring on an inner portion thereof. A compression device applies a force to the spacers sufficient to compress the springs against opposite sides of the laser bar to thereby retain the laser bar during the facet coating operation. Subsequent to the facet coating operation, the compressive force is released to decompress the springs and thereby release the laser bar. Due to the spring action, the laser bar is released without substantially adhering to either one of the spacers.

Preferably, each spacer is comprised of a generally solid rectangular member to which the compressive force is applied, and a wide angle, V-shaped spring attached to the rectangular member.

Advantageously, since the abrupt spring release action automatically loosens the laser bars from the spacers, the yield-reducing shaking or prying operations otherwise necessary to loosen the laser bar are reduced or eliminated. Hence, embodiments of the invention beneficially improve the manufacturing yield of laser devices diced from the laser bars.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF THE PREFERRED EMBODIMENTS

Figure 2:
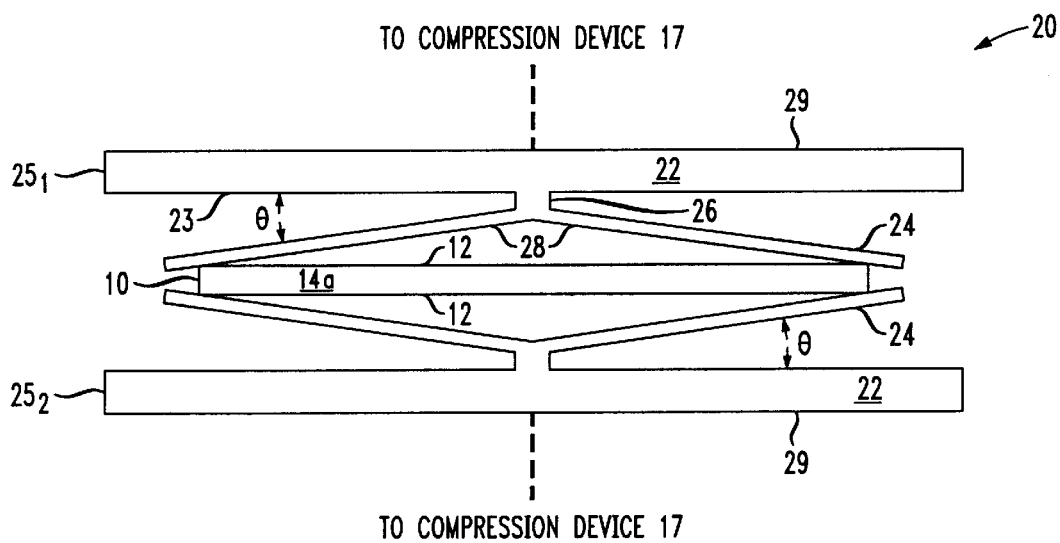
FIG. 2 is a top view of an illustrative embodiment of a laser bar holding fixture in accordance with the invention in an uncompressed state.
Figure 3:
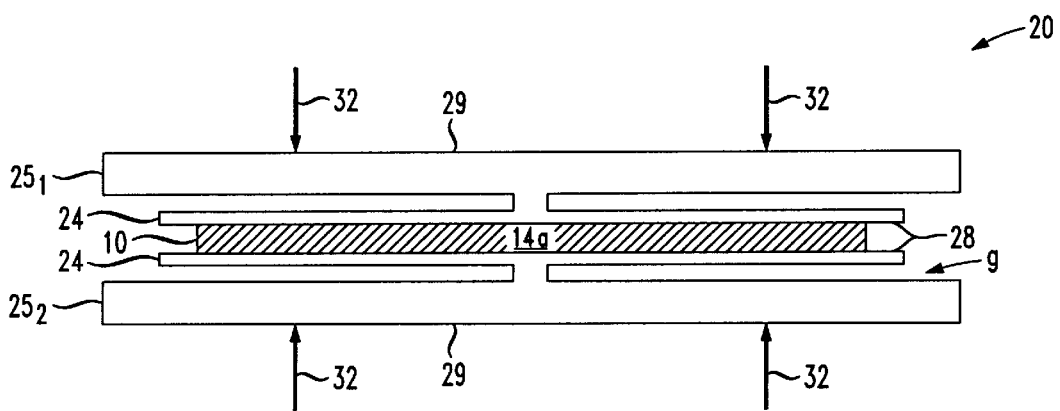
FIG. 3 is a top view of the illustrative holding fixture in a compressed state.

With reference now to FIG. 2, an exemplary embodiment 20 of the present invention is illustrated in a top view. Laser bar holding fixture 20 is comprised of a pair of fixture spacers $25_1$, $25_2$ for retaining laser bar 10 during a facet coating operation. These spacers replace the solid rectangular fixture blades $18_1$, $18_2$ of the prior art system discussed above. Each spacer $25_1$, $25_2$ includes a V-shaped flexible, compliant spring 24, each of which compresses against a respective side surface 12 of laser bar 10 to thereby retain the laser bar. Advantageously, when springs 24 are decompressed to release laser bar 10 following facet coating, the spring action enables them to automatically break away from the laser bar. That is, the laser bar does not generally adhere to the surfaces of either spring 24, thus reducing or obviating subsequent shaking or prying operations otherwise required to detach the laser bar from the holding fixture. Holding fixture 20 is illustrated in FIG. 2 in a decompressed state with springs 24 relaxed to release laser bar 10. FIG. 3 shows holding fixture 20 in a compressed state to retain laser bar 10 sandwiched against inner surfaces 28 of springs 24.

With continuing reference to FIG. 2, each spacer $25_1$, $25_2$ includes a solid rectangular member 22 with an outer surface 29 (in the z plane perpendicular to the page). A compressive force from a suitable compression member or members (not shown) of compression device 17 is applied to outer surface 29 of each spacer to compress the pair of spacers as shown in FIG. 3. The compression member of device 17 may include opposing plates or distributed springs that mate with outer surfaces 29 to allow a predetermined, controlled force to be applied evenly to rectangular members 22. Surfaces 29 of rectangular members 22 may be attached to the compression plates or springs of device 17. The compression device 17 can be a relatively simple, manually operated clamp or spring-loaded device. Alternatively, compression device 17 can be embodied as a more sophisticated, electronically controlled compression system. In any event, any suitable compression device capable of applying a small amount of compressive force against the spacers and abruptly releasing the same, may be employed.

Each compliant spring 24 extends from a post 26 extending from a central region of the associated rectangular member 22. (Post 26 may be considered part of spring 24.) Preferably, spring 24, post 26 and member 22 of each spacer are unitary, e.g., formed by machining from a thin sheet of metal. An angle θ is defined between each leg of spring 24 and the inner surface 23 of member 22 when spring 24 is in a relaxed (uncompressed) state. This angle θ, although shown exaggerated in FIG. 2 for clarity, is preferably small, e.g., less than 5°, and most preferably about 1°. Springs 24 are composed of any suitable spring-like material such as stainless steel or other metal alloy. The legs of springs 24 are thin, e.g., in the range of 0.002–0.005 inches (2–5 mils) to provide suitable flexibility.

With reference now to FIG. 3, spacers $25_1$ and $25_2$ are shown compressed against laser bar 10 whereby the laser bar is effectively held by holding fixture 20. In the compressed state, the legs of springs 24 flex back towards member 22 and essentially form a flat surface 28 which is compressed against and conforms with the respective side surface 12 of the laser bar. As such, only facets 14a and 14b are exposed for the facet coating operation. A predetermined force 32 is applied from compression device 17 to outer surfaces 29 to produce the desired compression. Depending on the dimensions of post 26, a small gap g of about one mil may be present between the legs of spring 24 and the inner surface of member 22.

Figure 4:
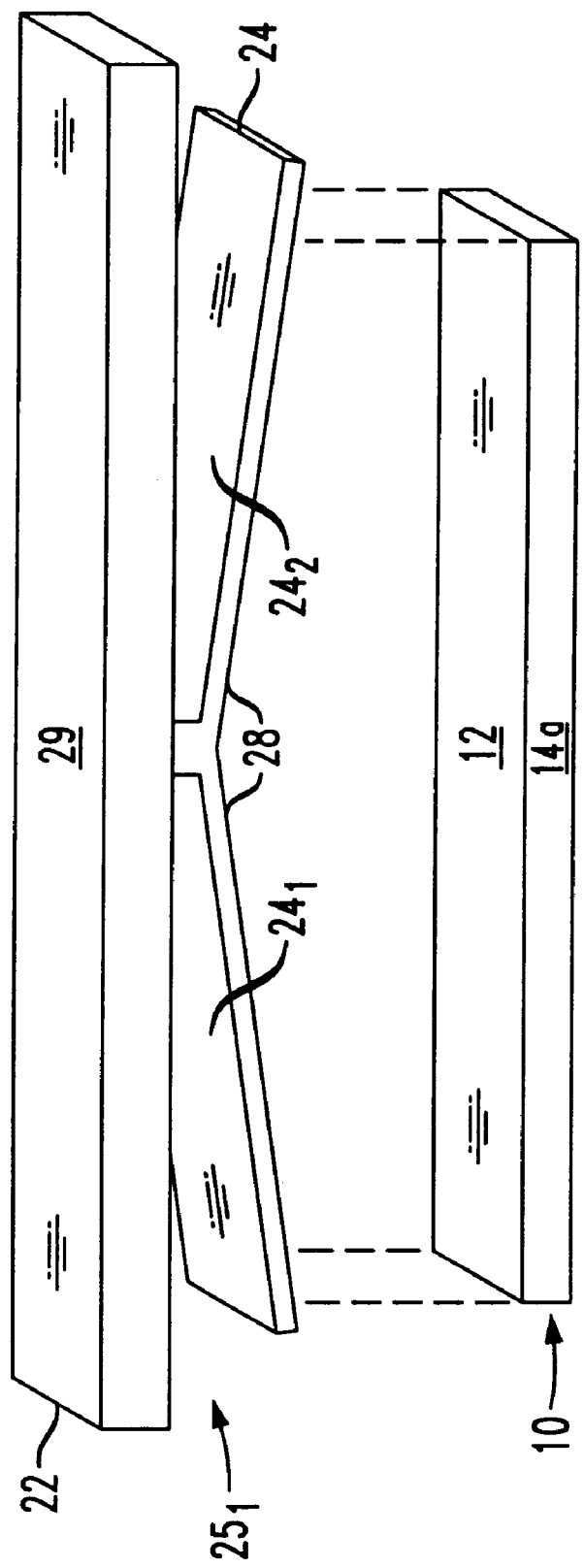
FIG. 4 is a perspective view of a holding fixture spacer in relation to a laser bar.

FIG. 4 is a perspective view depicting one of the spacers, $25_1$, in relation to laser bar 12. Spring 24 is defined by a pair of flexible members (legs) $24_1$ and $24_2$. Inner surface 28 of spring 24 is polished so as to avoid damage to laser bar surface 12 while laser bar 10 is compressibly retained against surface 28. The surface area of inner surface 28 of spring 24 is preferably larger than side surface 12 of laser bar 10 (e.g., spring 24 is preferably longer than surface 12, but about the same width).

Figure 1:
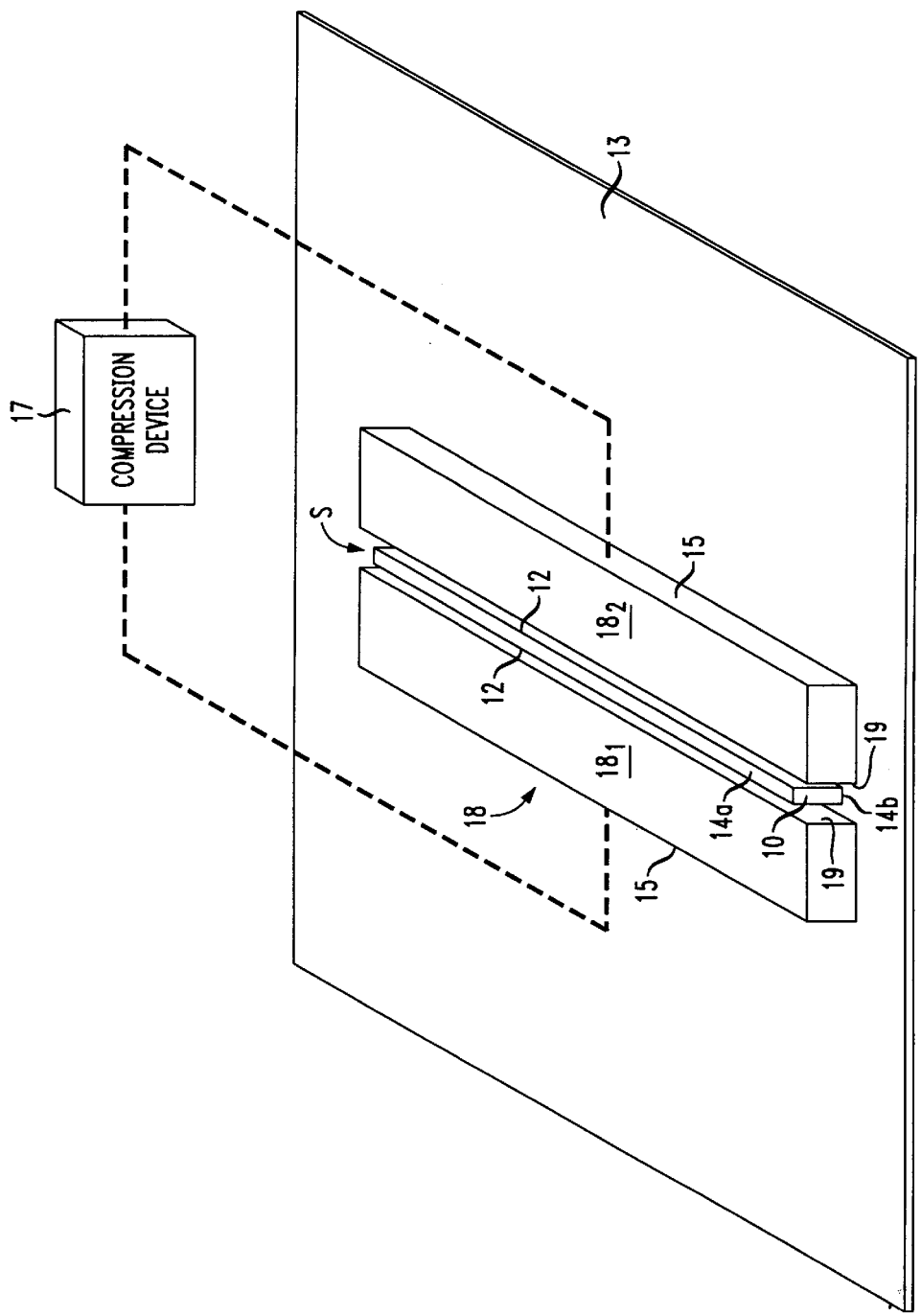
FIG. 1 illustrates a prior art laser bar holding fixture.
Figure 5:
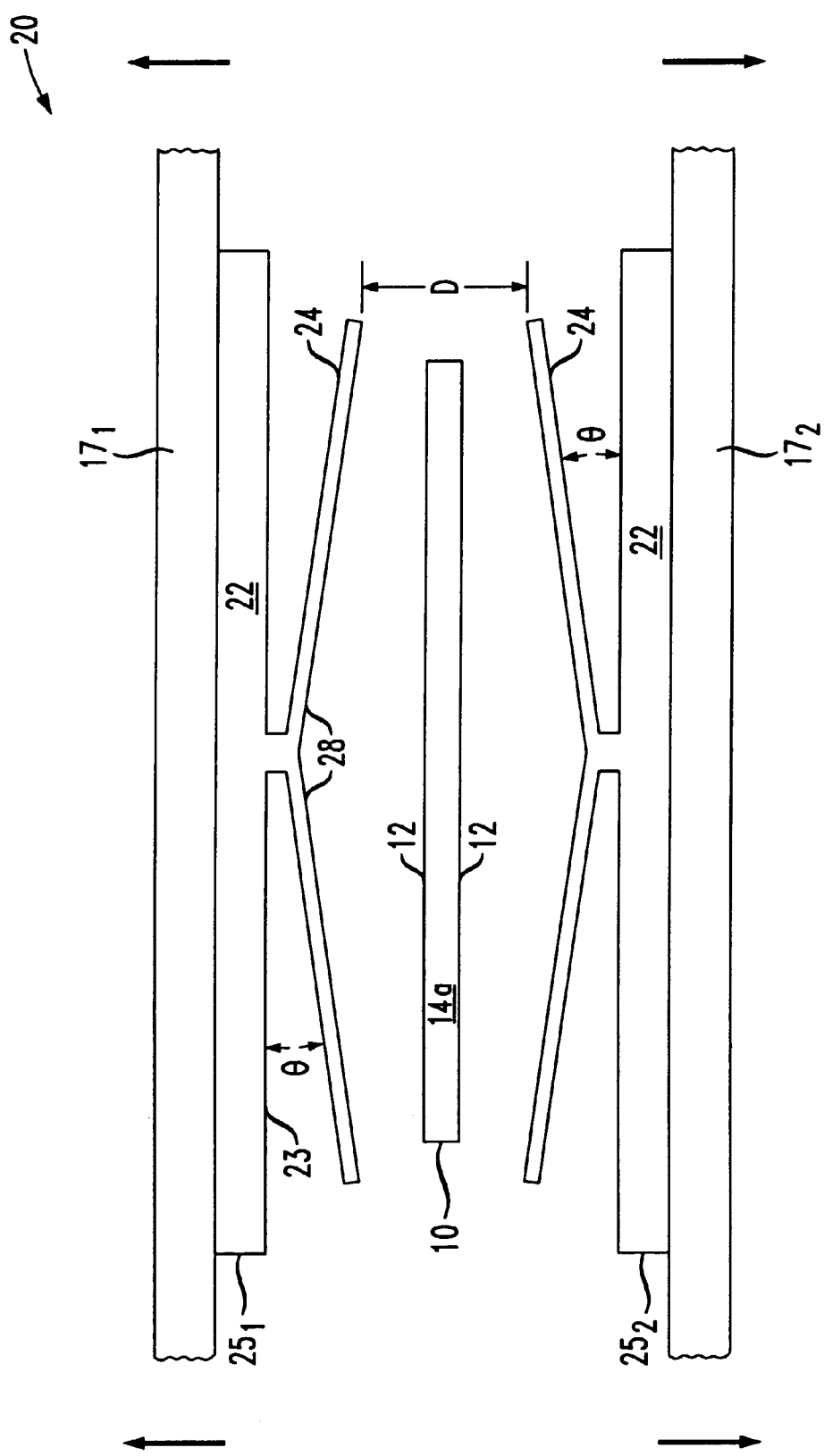
FIG. 5 shows the illustrative holding fixture with separated spacers following release of the laser bar.

Referring to FIG. 5, the facet coating process is carried out in an exemplary embodiment by first placing the laser bar to be coated in between spacers $25_1$, $25_2$ on a surface external to the facet coating apparatus. Spacers $25_1$, $25_2$ are then compressed against the laser bar to retain the same as was described earlier in reference to FIG. 3. As laser bar 10 is sandwiched between the spacers, the holding fixture 20 is transported to a facet coating apparatus (facet coater or chamber), not shown in the figures. A commercially available facet coater may be employed, such as one of those manufactured by the Eddy company, located in Applevalley, Calif. With the fixture spacers remaining compressed, the facet coater is operated to coat respective upper and lower facets 14a and 14b of the laser bar with an optical coating. Typically, one facet surface 14a or 14b is coated at a time. Following the coating of one facet, the entire holding fixture 20 is flipped by 180° while laser bar 10 remains sandwiched between the spacers, so as to expose the other facet for coating. Upon completion of the coating operation, the holding fixture 20 is transported atop a receiving surface (as surface 13 of FIG. 1) with facet 14b resting thereon. Then, as shown in FIG. 5, spacers $25_1$, $25_2$ are abruptly decompressed and pulled apart to a predetermined separation distance D to release laser bar 10 onto the receiving surface. Due to the spring release action of springs 24 against laser bar 10, the laser bar is effectively loosened and separated from the springs.

Also shown in FIG. 5 are spring loaded mating plates $17_1$ and $17_2$, part of an exemplary compression device 17, which plates are attached in this example to opposing rectangular members 22. These plates are compressed to retain the laser bar and abruptly separated to release the same. A single pair of long plates $17_1$, $17_2$ can be used to retain and then release a number of holding fixtures 20 simultaneously to allow for an efficient manufacturing operation.

Accordingly, with proper design of spacers $25_1$, $25_2$, most laser bars will not adhere, or only minimally adhere, to springs 24. Laser bars that do stick to one or both springs can usually be loosened by a simple shaking operation without the necessity of prying the laser bar loose with a tool. As a result, the overall yield is improved relative to the above-discussed prior art.

While the present invention has been described above with reference to specific embodiments thereof, it is understood that one skilled in the art may make many modifications to the disclosed embodiments without departing from the spirit and scope of the invention. For instance, while the spacer springs 24 have been shown and described as V-shaped springs, it may be possible to employ other types of compliant springs in the alternative. Accordingly, these and other modifications are intended to be included within the scope of the invention as defined by the appended claims.

What is claimed is:

1. A method of manufacturing a laser bar containing a plurality of laser devices, comprising:

placing the laser bar between a pair of opposing spacers, each spacer including a compliant spring on an inner portion thereof;

compressing said spacers such that said springs compress against opposite sides of said laser bar to thereby retain said laser bar, said spacers remaining compressed during a facet coating operation; and decompressing said spacers subsequent to said facet coating operation to thereby release said laser bar without said laser bar substantially adhering to either one of said springs.

2. The method of claim 1 wherein said decompressing step comprises abruptly pulling said spacers apart.

3. The method of claim 1 wherein each said spring is V-shaped.

4. The method of claim 1 wherein each said spacer further includes a solid rectangular member to which said spring is attached, and said compression step comprises applying a compressive force to said rectangular members.

* * * * *